(12) United States Patent
Wu

(10) Patent No.: US 10,879,125 B2
(45) Date of Patent: Dec. 29, 2020

(54) FINFET STRUCTURE AND METHOD OF MANUFACTURING THE SAME

(71) Applicant: NANYA TECHNOLOGY CORPORATION, New Taipei (TW)

(72) Inventor: Chun-Heng Wu, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/376,578

(22) Filed: Apr. 5, 2019

(65) Prior Publication Data

US 2020/0211900 A1 Jul. 2, 2020

Related U.S. Application Data

(60) Provisional application No. 62/785,418, filed on Dec. 27, 2018.

(51) Int. Cl.
*H01L 21/8234* (2006.01)
*H01L 29/66* (2006.01)
*H01L 29/78* (2006.01)
*H01L 27/088* (2006.01)
*H01L 29/10* (2006.01)

(52) U.S. Cl.
CPC ............... *H01L 21/823412* (2013.01); *H01L 21/823431* (2013.01); *H01L 27/0886* (2013.01); *H01L 29/1037* (2013.01); *H01L 29/6653* (2013.01); *H01L 29/66545* (2013.01); *H01L 29/66795* (2013.01); *H01L 29/66818* (2013.01); *H01L 29/7851* (2013.01)

(58) Field of Classification Search
CPC ..... H01L 21/823412; H01L 21/823431; H01L 29/785; H01L 29/6653; H01L 29/66545; H01L 29/66553; H01L 29/66795; H01L 29/6681; H01L 29/66818
See application file for complete search history.

(56) References Cited

U.S. PATENT DOCUMENTS

| | | |
|---|---|---|
| 2005/0029603 A1 | 2/2005 | Yu et al. |
| 2013/0285143 A1 | 10/2013 | Oh et al. |
| 2017/0005090 A1* | 1/2017 | Ando ................. H01L 27/0886 |
| 2017/0133377 A1* | 5/2017 | Glass ................. H01L 27/0924 |
| 2018/0240895 A1* | 8/2018 | Chang ............... H01L 21/02266 |
| 2018/0337183 A1 | 11/2018 | Glass et al. |
| 2018/0366568 A1 | 12/2018 | Huang |
| 2018/0374927 A1* | 12/2018 | Liu ................... H01L 29/42376 |

OTHER PUBLICATIONS

Office Action dated Jan. 7, 2020 related to Taiwanese Application No. 108124922.

* cited by examiner

*Primary Examiner* — Matthew E Warren
(74) *Attorney, Agent, or Firm* — Muncy, Geissler, Olds & Lowe, P.C.

(57) ABSTRACT

The present disclosure relates to a FinFET structure and a method of manufacturing the same. The FinFET structure includes a first fin and a second fin. The first fin is over a first base and has a first channel region. The first channel region has a first channel length. The second fin is over a second base and has a second channel region. The second channel region has a second channel length. The second channel length is different from the first channel length.

9 Claims, 7 Drawing Sheets

FINFET STRUCTURE AND METHOD OF MANUFACTURING THE SAME

PRIORITY CLAIM AND CROSS REFERENCE

This application claims the priority benefit of U.S. provisional application Ser. No. 62/785,418, filed on Dec. 27, 2018. The entirety of the above-mentioned patent application is hereby incorporated by reference herein and made a part of this specification.

TECHNICAL FIELD

The present disclosure relates to a FinFET structure and a method of manufacturing the same, and more particularly, to a FinFET structure having different channel lengths and a method of manufacturing the same.

DISCUSSION OF THE BACKGROUND

Semiconductor devices are essential for many modern applications. With the advancement of electronic technology, semiconductor devices are steadily becoming smaller while providing greater functionality and including greater amounts of integrated circuits. Due to the miniaturized scale of semiconductor devices, fin structures are widely used in field-effect transistors.

A conventional FinFET structure is provided. The FinFET structure includes a semiconductor substrate and a plurality of fins extending away from the semiconductor substrate. However, each of the fins has the same channel length, and the current running along sidewalls and tops of the fins cannot be different.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a FinFET structure. The FinFET structure includes a first fin over a first base, the first fin having a first channel region, wherein the first channel region has a first channel length; and a second fin over a second base, the second fin having a second channel region, wherein the second channel region has a second channel length, and the second channel length is different from the first channel length.

In some embodiments, the FinFET structure further includes a semiconductor substrate, wherein the semiconductor substrate includes the first base and the second base.

In some embodiments, the first fin extends along a first direction, the first channel length is measured along a second direction perpendicular to the first direction, the second fin extends along the first direction, and the second channel region has the second channel length measured along the second direction.

In some embodiments, the first fin includes a first bottom portion embedded in a first isolation layer over the first base and a first top portion over the first bottom portion, the second fin includes a second bottom portion embedded in a second isolation layer over the second base and a second top portion over the second bottom portion, the first top portion includes the first channel region, and the second top portion includes the second channel region.

In some embodiments, the first top portion has a first drain region, a first source region and the first channel region between the first drain region and the first source region, and the first drain region, the first channel region and the first source region are arranged along the second direction.

In some embodiments, the first channel region of the first top portion has a first channel width measured along a third direction perpendicular to the second direction and the first direction; the first drain region and the first source region of the first fin have a first top width; and the first channel width is different from the first top width.

In some embodiments, the first channel width is smaller than the first top width.

In some embodiments, the first bottom portion has a first bottom width extending in the third direction, and the first channel width is smaller than the first bottom width.

In some embodiments, the first fin and the second fin are formed monolithically with the semiconductor substrate.

In some embodiments, the FinFET structure further includes a first gate covering the first channel region and a second gate covering the second channel region.

Another aspect of the present disclosure provides a method of manufacturing a FinFET structure. The method includes forming a first fin over a semiconductor substrate, wherein the first fin includes a first bottom portion embedded in a first isolation layer over the semiconductor substrate and a first top portion over the first bottom portion; forming a blocking layer, wherein the blocking layer includes two blocking dams on the first top portion, wherein at least one of the blocking dams has a first dam width measured along a second direction; trimming the blocking dam so that a width of the blocking dam is reduced from the first dam width to a second dam width smaller than the first dam width, wherein a portion of the first top portion between the two blocking dams is defined as a first channel region, and the first channel region has a first channel length measured along the second direction.

In some embodiments, the method further includes forming a dummy gate covering a portion of the first top portion before forming a blocking layer, wherein the dummy gate is between the two blocking dams after the forming of the blocking layer; and removing the dummy gate, wherein the two blocking dams and the portion of the first top portion are exposed.

In some embodiments, the blocking layer further includes a blocking cap on a top of the dummy gate, wherein the blocking cap is removed during the removing of the dummy gate.

In some embodiments, the method further includes forming a dielectric layer covering the first fin and the first isolation layer before removing the blocking cap and the dummy gate.

In some embodiments, the method further includes forming a mask layer covering the dielectric layer, wherein the mask layer has an aperture corresponding to the dummy gate, before removing the blocking cap and the dummy gate.

In some embodiments, the two blocking dams are spaced apart from each other and the two blocking dams are arranged along the second direction.

In some embodiments, the first channel region has a first top width measured along a third direction perpendicular to the second direction.

In some embodiments, the method further includes a step of forming at least one semiconductor component on the semiconductor substrate.

In some embodiments, the first fin extends vertically from the semiconductor substrate along a first direction perpendicular to the third direction and the second direction.

In some embodiments, the method further includes trimming the first channel region to reduce a width of the first channel region from the first top width to a first channel width smaller than the first top width.

In some embodiments, the method further includes forming a first drain region and a first source region adjacent to the first channel region, wherein the first drain region, the first channel region and the first source region are arranged along the second direction, and each of the first drain region and the first source region of the first fin has a first top width measured along the third direction, wherein the first top width is larger than the first channel width.

With the above-mentioned configurations of the FinFET structure, the channel length of the fin can be adjusted.

The foregoing has outlined rather broadly the features and technical advantages of the present disclosure in order that the detailed description of the disclosure that follows may be better understood. Additional features and technical advantages of the disclosure are described hereinafter and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
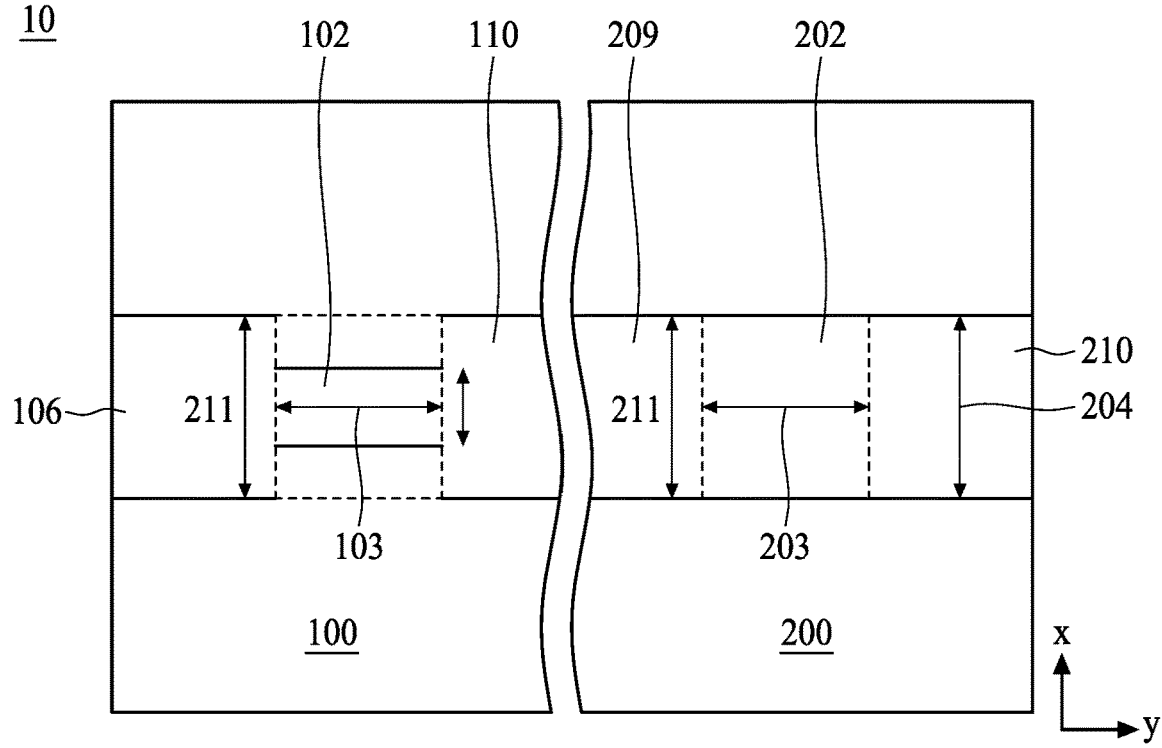
FIG. 1 is a top view of a FinFET structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprise" and "comprising," when used in this specification, point out the presence of stated features, integers, steps, operations, elements, or components, but do not preclude the presence or addition of one or more other features, integers, steps, operations, elements, components, or groups thereof.

To clearly explain embodiments below, some embodiments are described on basis of z-axis direction (first direction), y-axis direction (second direction) and x-axis direction (third direction), and those directions are substantially perpendicular to one another.

Figure 2:
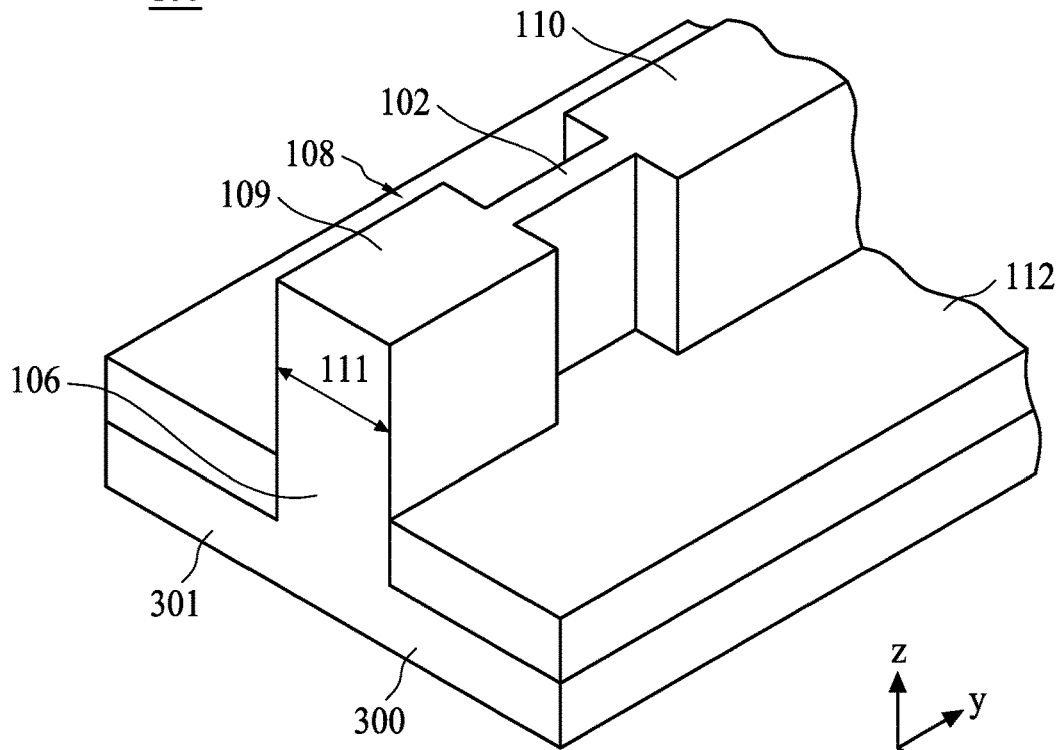
FIG. 2 is a partial perspective view of a first fin of the FinFET structure in accordance with some embodiments of the present disclosure.
Figure 3:
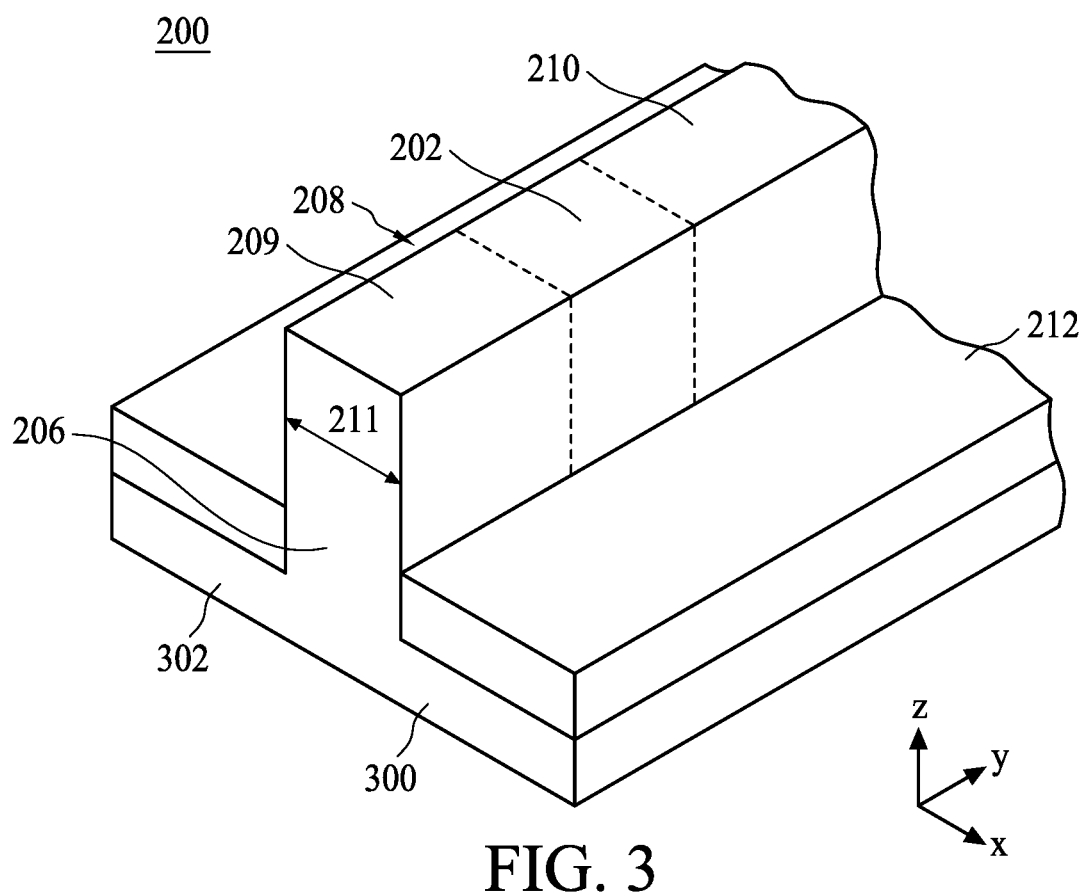
FIG. 3 is a partial perspective view of a second fin of the FinFET structure in accordance with some embodiments of the present disclosure.

FIG. 1 is a top view of a FinFET structure 10 in accordance with some embodiments of the present disclosure, FIG. 2 is a partial perspective view of a first fin 100 of the FinFET structure 10 in accordance with some embodiments of the present disclosure, and FIG. 3 is a partial perspective view of a second fin 200 of the FinFET structure 10 in accordance with some embodiments of the present disclosure.

Referring to FIG. 2, in some embodiments, the FinFET structure 10 includes a semiconductor substrate 300 having a first base 301, and the first fin 100 is disposed over the first base 301. In some embodiments, the first fin 100 is formed monolithically with the semiconductor substrate 300 and protrudes from the semiconductor substrate 300 in the z-axis direction. In some embodiments, the first fin 100 is formed by etching the semiconductor substrate 300 or through an epitaxial growth process. In some embodiments, the first fin 100 is grown from silicon, polycrystalline silicon, or single-crystal silicon.

Referring to FIG. 2, the first fin 100 has a first channel region 102, which is covered by a first gate (not shown in FIG. 2). In some embodiments, the first fin 100 includes a first bottom portion 106 and a first top portion 108, the first bottom portion 106 is embedded in a first isolation layer 112 over the first base 301, and the first top portion 108 is disposed over the first bottom portion 106. In some embodiments, the first top portion 108 includes the first channel region 102. In some embodiments, the first isolation layer 112 may be deposited on trenches adjacent to the first fin 100 through chemical vapor deposition (CVD), spin-on deposition (SOD), or the like.

Referring to FIG. 2, the first top portion 108 has a first drain region 109, a first source region 110 and the first channel region 102 between the first drain region 109 and the first source region 110. In some embodiments, the first drain region 109, the first channel region 102 and the first source region 110 are arranged along the y-axis direction.

Referring to FIG. 3, in some embodiments, the semiconductor substrate 300 has a second base 302, and the second fin 200 is over the second base 302. In some embodiments, the second fin 200 is formed monolithically with the semiconductor substrate 300 and protrudes from the semiconductor substrate 300 in the z-axis direction. In some embodiments, the second fin 200 is formed by etching the semiconductor substrate 300 or through an epitaxial growth process. In some embodiments, the second fin 200 is grown from silicon, polycrystalline silicon, or single-crystal silicon.

Referring to FIG. 3, the second fin 200 has a second channel region 202, which is covered by a second gate (not shown in FIG. 3). In some embodiments, the second fin 200 includes a second bottom portion 206 and a second top portion 208, the second bottom portion 206 is embedded in a second isolation layer 212 over the second base 302, and the second top portion 208 is disposed over the second bottom portion 206. In some embodiments, the second top portion 208 includes the second channel region 202. In some embodiments, the second isolation layer 212 may be deposited on trenches adjacent to the second fin 200 through chemical vapor deposition (CVD), spin-on deposition (SOD), or the like.

Referring to FIG. 3, in some embodiments, the second top portion 208 has a second drain region 209, a second source region 210 and the second channel region 202 between the second drain region 209 and the second source region 210. In some embodiments, the second drain region 209, the second channel region 202 and the second source region 210 are arranged along the y-axis direction.

Referring back to FIG. 1, in some embodiments, the first channel region 102 has a first channel length 103, which is measured along the y-axis direction. In some embodiments, the second channel region 202 has a second channel length 203, which is measured along the y-axis direction. In some embodiments, the second channel length 203 is different from the first channel length 103. In some embodiments, the second channel length 203 is smaller than the first channel length 103.

Figure 4:
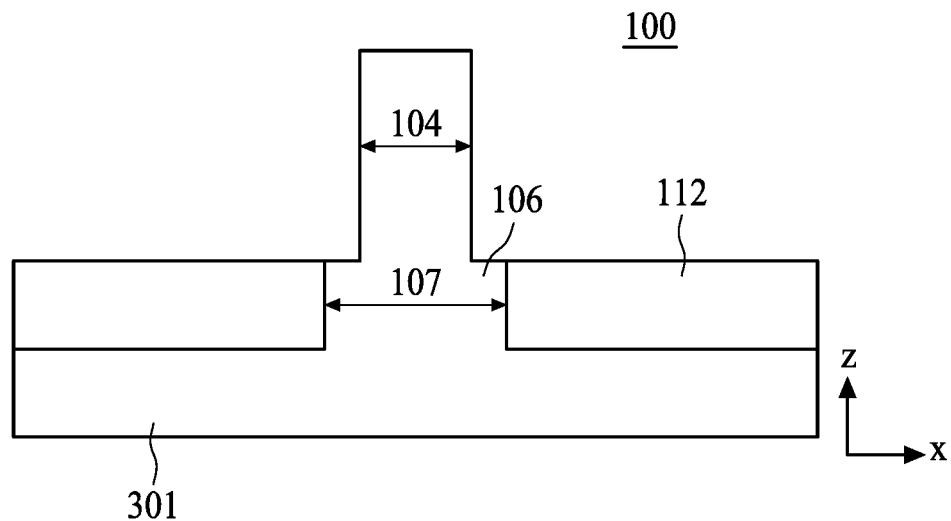
FIG. 4 is a cross-sectional view of the first channel region of the first fin in FIG. 1 in accordance with some embodiments of the present disclosure.

FIG. 4 is a cross-sectional view of the first channel region 102 of the first fin 100 in FIG. 1 in accordance with some embodiments of the present disclosure. Referring to FIG. 4, in some embodiments, the first channel region 102 of the first fin 100 has a first channel width 104 measured along the x-axis direction. In some embodiments, the first bottom portion 106 has a first bottom width 107 along the x-axis direction, and the first channel width 104 is smaller than the first bottom width 107.

Referring to FIG. 2 and FIG. 4, in some embodiments, the first drain region 109 and the first source region 110 of the first fin 100 have a first top width 111 in FIG. 2, and the first channel width 104 in FIG. 4 is different from the first top width 111. In some embodiments, the first channel width 104 is smaller than the first top width 111.

Figure 5:
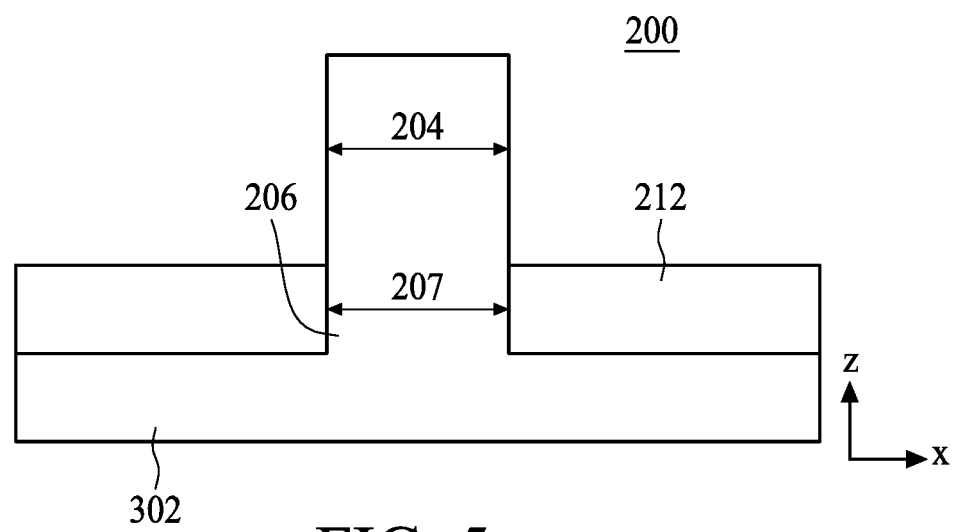
FIG. 5 is a cross-sectional view of the second channel region of the second fin in FIG. 1 in accordance with some embodiments of the present disclosure.

FIG. 5 is a cross-sectional view of the second channel region 202 of the second fin 200 in FIG. 1 in accordance with some embodiments of the present disclosure. Referring to FIG. 5, in some embodiments, the second channel region 202 of the second fin 200 has a second channel width 204 measured along the x-axis direction. In some embodiments, the second bottom portion 206 has a second bottom width 207 along the x-axis direction, and the second channel width 204 is the same as the second bottom width 207.

Referring to FIG. 3 and FIG. 5, in some embodiments, the second drain region 209 and the second source region 210 of the second fin 200 have a second top width 211, and the second channel width 204 is the same as the second top width 211.

Figure 6:
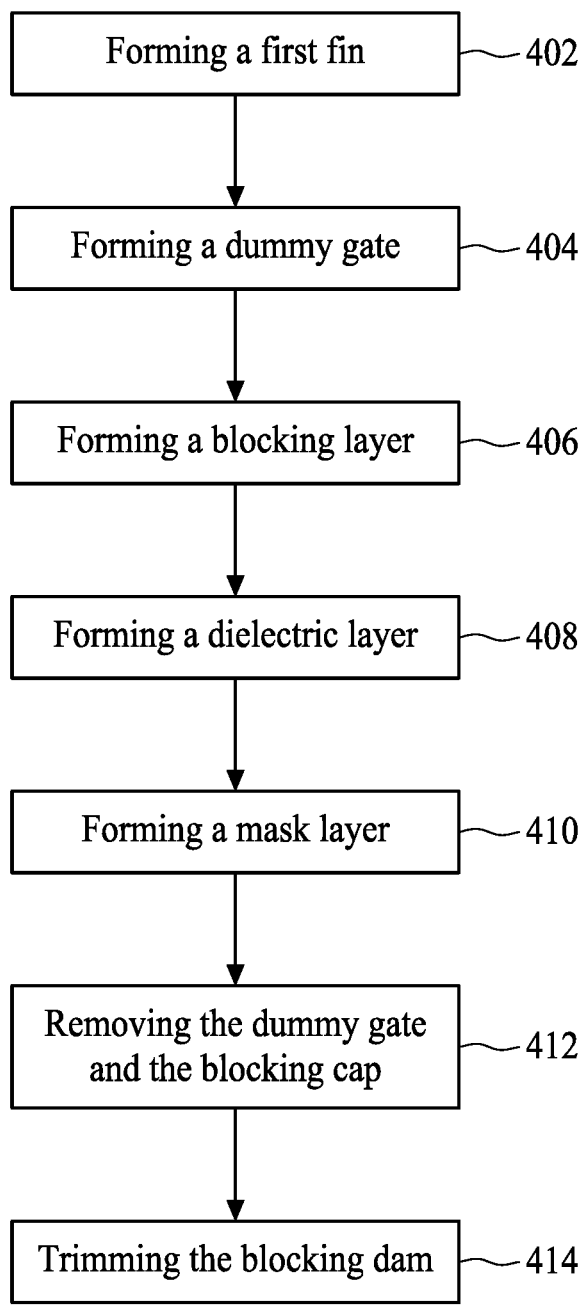
FIG. 6 is a flow diagram illustrating a method of manufacturing a FinFET structure in accordance with some embodiments of the present disclosure.

FIG. 6 is a flow diagram illustrating a method 400 of manufacturing a FinFET structure in accordance with some embodiments of the present disclosure. FIGS. 7 to 13 are schematic views of intermediate stages in the process of manufacturing a FinFET structure in accordance with some embodiments of the present disclosure. In some embodiments, the method 400 includes a number of operations (402, 404, 406, 408, 410, 412 and 414), and the description and illustration below are not deemed as a limitation to the sequence of the operations.

Figure 7:
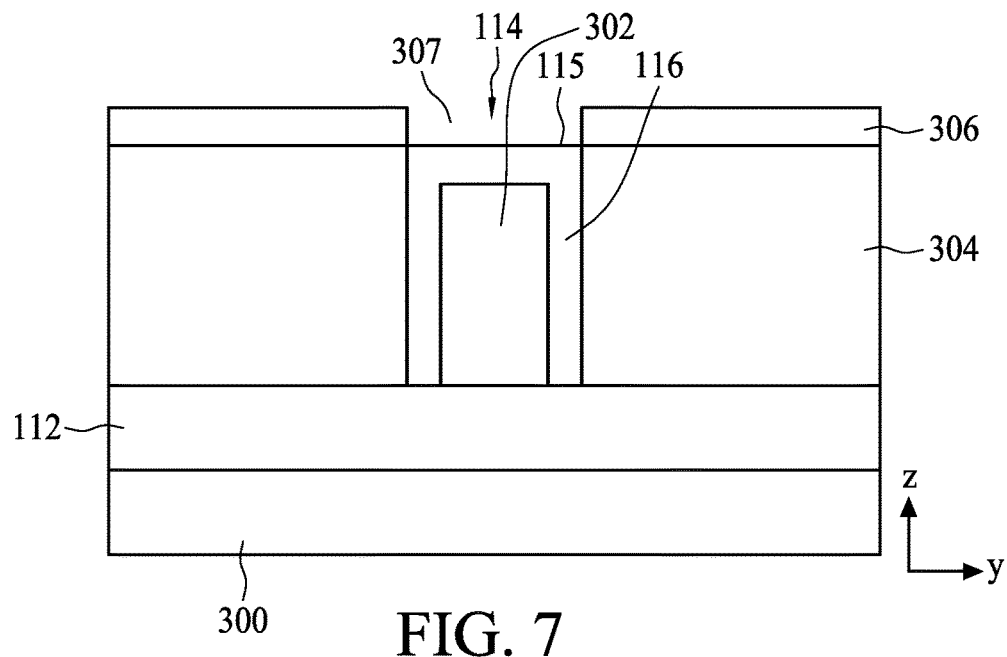
FIGS. 7 to 13 are schematic views of intermediate stages in the process of manufacturing a FinFET structure in accordance with some embodiments of the present disclosure.
Figure 8:
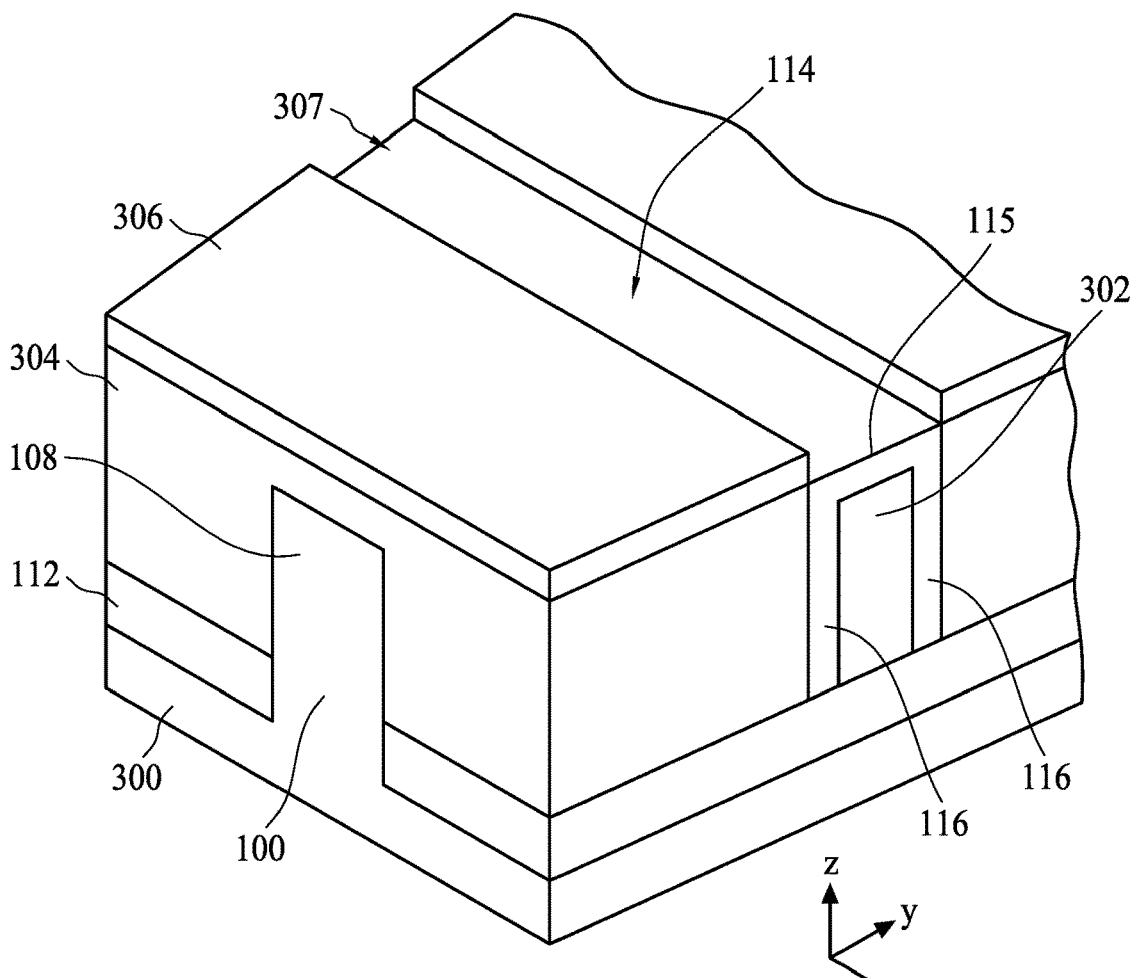

As shown in FIGS. 7 and 8, in some embodiments, according to the operation 402, the first fin 100 is formed over a semiconductor substrate 300. The first fin 100 includes a first bottom portion 106 embedded in a first isolation layer 112 over the semiconductor substrate 300 and a first top portion 108 over the first bottom portion 106. In some embodiments, the first fin 100 extends vertically from the semiconductor substrate 300 in the z-axis direction.

In some embodiments, the first fin 100 is formed by etching the semiconductor substrate 300 or through an epitaxial growth process. In some embodiments, the first fin 100 is grown from silicon, polycrystalline silicon, or single-crystal silicon. In some embodiments, the first isolation layer 112 may be deposited on trenches adjacent to the first fin 100 through chemical vapor deposition (CVD), spin-on deposition (SOD), or the like.

As shown in FIGS. 7 and 8, in some embodiments, according to the operation 404, a dummy gate 302 is formed. In some embodiments, a portion of the first top portion 108 is covered by the dummy gate 302. In some embodiments, the dummy gate 302 may include polysilicon, oxide material or the like.

As shown in FIGS. 7 and 8, in some embodiments, according to the operation 406, a blocking layer 114 is formed on the dummy gate 302. In some embodiments, the blocking layer 114 includes a blocking cap 115 on a top of the dummy gate 302 and two blocking dams 116 on the first top portion 108 of the first fin 100. In some embodiments, the two blocking dams 116 are spaced apart from each other and the two blocking dams 116 are arranged along the y-axis direction. In some embodiments, the dummy gate 302 is between the two blocking dams 116. In some embodiments, at least one of the blocking dams 116 has a first dam width 117 (shown in FIG. 10) measured along the y-axis direction. In some embodiments, the blocking layer 114 can be deposited and etched to form a shape as shown in FIGS. 7 and 8.

In some embodiments, as shown in FIGS. 7 and 8, according to the operation 408, a dielectric layer 304 is formed. In some embodiments, the dielectric layer 304 covers the first fin 100 and the first isolation layer 112. In some embodiments, the dielectric layer 304 includes oxide material or the like. In some embodiments, the dielectric layer 304 may be formed by any suitable process, such as chemical vapor deposition (CVD), physical vapor deposition (PVD), atomic layer deposition (ALD), or the like.

In some embodiments, as shown in FIGS. 7 and 8 and according to the operation 410, a mask layer 306 is formed. In some embodiments, the dielectric layer 304 is covered by the mask layer 306. In some embodiments, the mask layer 306 has an aperture 307 corresponding to the dummy gate 302. In some embodiments, the mask layer 306 may be a hard mask. In some embodiments, the mask layer 306 may be formed by any suitable process, such as chemical vapor deposition (CVD), physical vapor deposition (PVD), atomic layer deposition (ALD), or the like.

Figure 9:
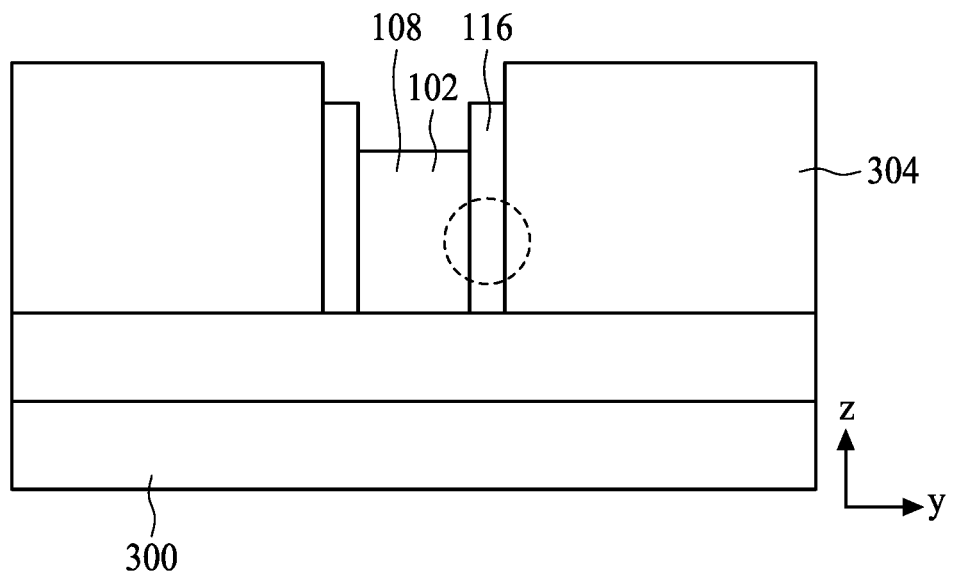

As shown in FIG. 9, in some embodiments, according to the operation 412, the dummy gate 402 and the blocking cap 115 are removed. In some embodiments, the two blocking dams 116 and a portion of the first top portion 108 are exposed. In some embodiments, such removal may be done by using any suitable etching process, polishing process, or the like.

Figure 10:
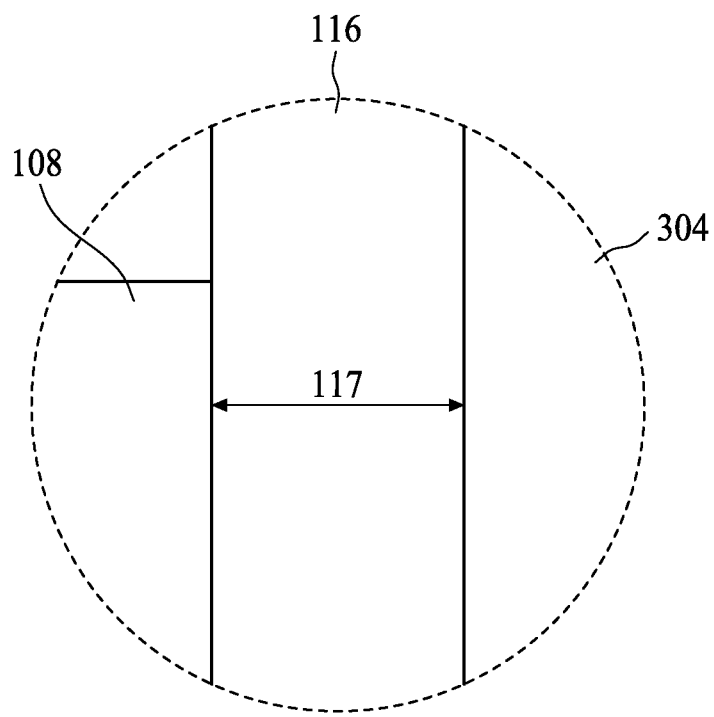
Figure 11:
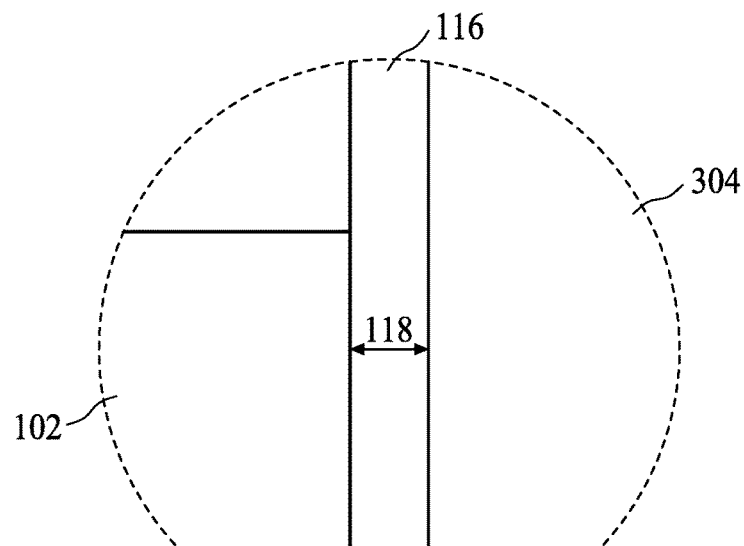

FIGS. 10 and 11 are partial enlarged views of FIG. 9. As shown in FIGS. 10 and 11, in some embodiments, according to the operation 414, the blocking dam 116 is trimmed so that a width of the blocking dam 116 is reduced from the first dam width 117 to a second dam width 118, wherein the second dam width 118 is smaller than the first dam width 117. In some embodiments, a portion of the first top portion 108 between the two blocking dams 116 is defined as the first channel region 102. In some embodiments, the first channel region 102 has a first channel length 103 measured along the y-axis direction. In some embodiments, the blocking dam 116 may be trimmed through an etching process.

Figure 12:
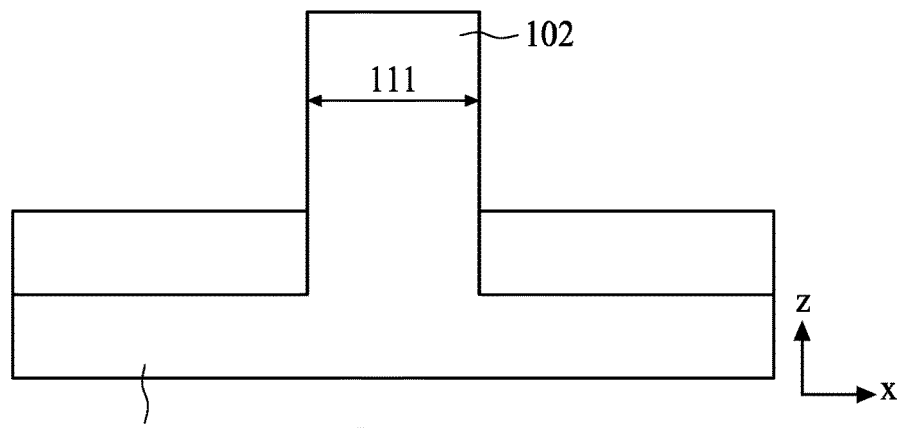
Figure 13:
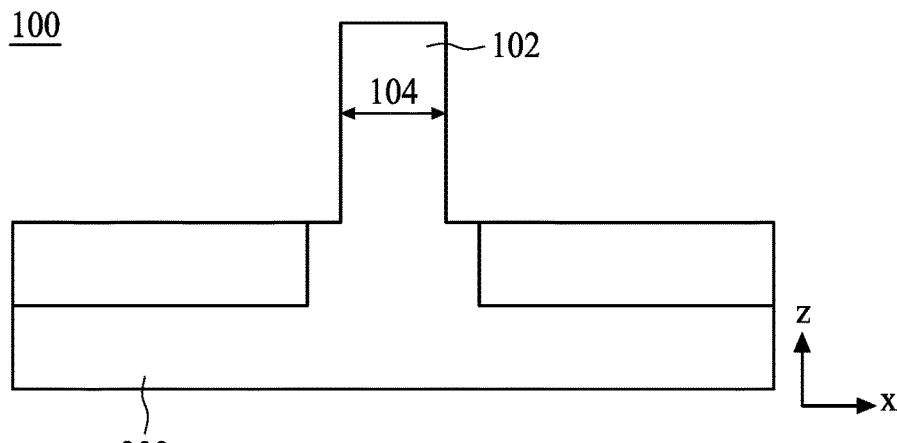

In some embodiments, as shown in FIG. 12, the first channel region 102 has a first top width 111 measured along the x-axis direction before the trimming of the first channel region 102. In some embodiments, as shown in FIGS. 12 and 13, the first channel region 102 is trimmed so that a width of the first channel region 102 is reduced from the first top width 111 to a first channel width 104 smaller than the first top width 111. In some embodiments, the first channel region 102 may be trimmed through an etching process.

In conclusion, with the configuration of the FinFET structure, the channel lengths of the fins can be different, so that the different fins can have a different current along the channel region.

One aspect of the present disclosure provides a FinFET structure. The FinFET structure includes a first fin over a first base, the first fin having a first channel region, wherein the first channel region has a first channel length; and a second fin over a second base, the second fin having a second channel region, wherein the second channel region has a second channel length, and the second channel length is different from the first channel length.

Another aspect of the present disclosure provides a method of manufacturing a FinFET structure. The method includes forming a first fin over a semiconductor substrate, wherein the first fin includes a first bottom portion embedded in a first isolation layer over the semiconductor substrate and a first top portion over the first bottom portion; forming a blocking layer, wherein the blocking layer includes two blocking dams on the first top portion, wherein at least one of the blocking dams has a first dam width measured along a y-axis direction; trimming the blocking dam from the first dam width to a second dam width smaller than the first dam width, wherein a portion of the first top portion between the two blocking dams is defined as a first channel region, and the first channel region has a first channel length measured along the y-axis direction.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method of manufacturing a FinFET structure, comprising:
  forming a first fin over a semiconductor substrate and extending along a second direction, wherein the first fin includes a first bottom portion embedded in a first isolation layer over the semiconductor substrate and a first top portion over the first bottom portion;
  forming a blocking layer, wherein the blocking layer includes two blocking dams disposed on the first top portion, wherein the two blocking dams are spaced apart from each other and arranged along the second direction, wherein at least one of the blocking dams has a first dam width measured along the second direction;
  trimming the blocking dam along the second direction so that a width of the block dam is reduced from the first dam width to a second dam width smaller than the first dam width, wherein a portion of the first top portion between the two blocking dams is defined as a first channel region, and the first channel region has a first channel length measured along the second direction.

2. The method of claim 1, further comprising:
  forming a dummy gate covering a portion of the first top portion before forming a blocking layer, wherein the dummy gate is between the two blocking dams after the forming of the blocking layer; and
  removing the dummy gate, wherein the two blocking dams and the portion of the first top portion are exposed.

3. The method of claim 2, wherein the blocking layer further includes a blocking cap on a top of the dummy gate, wherein the blocking cap is removed during the removing of the dummy gate.

4. The method of claim 3, further comprising: forming a dielectric layer covering the first fin and the first isolation layer before removing the blocking cap and the dummy gate.

5. The method of claim 4, further comprising: forming a mask layer covering the dielectric layer, wherein the mask layer has an aperture corresponding to the dummy gate, before removing the blocking cap and the dummy gate.

6. The method of claim 1, wherein the first channel region has a first top width measured along a third direction perpendicular to the second direction before the trimming of the first channel region.

7. The method of claim 6, wherein the first fin extends vertically from the semiconductor substrate in a first direction perpendicular to the third direction and the second direction.

8. The method of claim 6, further comprising: trimming the first channel region so that a width of the first channel region is reduced from the first top width to a first channel width smaller than the first top width.

9. The method of claim 8, further comprising: forming a first drain region and a first source region adjacent to the first channel region, wherein the first drain region, the first channel region and the first source region are arranged along the second direction, and each of the first drain region and the first source region of the first fin has the first top width measured along the third direction, wherein the first top width is larger than the first channel width.

\* \* \* \* \*